US007493221B2

(12) United States Patent
Caggiano et al.

(10) Patent No.: US 7,493,221 B2
(45) Date of Patent: Feb. 17, 2009

(54) SYSTEM FOR POWER SUB-METERING

(75) Inventors: Robert Joseph Caggiano, Wolcott, CT (US); Radhika Dixit, Westlake, OH (US); Julia Maria Fonseca, Louisville, KY (US); Cecil Rivers, Jr., Hartford, CT (US); Ertugrul Berkcan, Clifton Park, NY (US); Roossely Delica, Hartford, CT (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/536,377

(22) Filed: Sep. 28, 2006

(65) Prior Publication Data

US 2008/0082275 A1 Apr. 3, 2008

(51) Int. Cl.
G06F 19/00 (2006.01)
(52) U.S. Cl. ...................................... 702/61
(58) Field of Classification Search .............. 702/61
See application file for complete search history.

(56) References Cited

U.S. PATENT DOCUMENTS

| 4,384,289 | A | 5/1983 | Stillwell et al. |
| 4,827,272 | A | 5/1989 | Davis |
| 4,847,780 | A | 7/1989 | Gilker et al. |
| 4,916,392 | A | 4/1990 | Sendeff et al. |
| 5,426,360 | A | 6/1995 | Maraio et al. |
| 5,502,374 | A | 3/1996 | Cota |
| 6,330,516 | B1 * | 12/2001 | Kammeter ............ 702/60 |
| 2003/0050737 | A1 | 3/2003 | Osann, Jr. |
| 2004/0032320 | A1 | 2/2004 | Zalitzky et al. |
| 2005/0248340 | A1 | 11/2005 | Berkcan et al. |
| 2005/0270014 | A1 | 12/2005 | Zribi et al. |
| 2006/0121785 | A1 | 6/2006 | Caggiano et al. |

FOREIGN PATENT DOCUMENTS

| EP | 0072422 A1 | 2/1983 |
| EP | 0233756 A1 | 8/1987 |
| EP | 1610142 A1 | 12/2005 |
| WO | 9946606 A2 | 9/1999 |

(Continued)

OTHER PUBLICATIONS http://en.wikipedia.org/wiki/Rs232, p. 1-10.*

(Continued)

Primary Examiner—Tung S Lau
(74) Attorney, Agent, or Firm—Cantor Colburn LLP

(57) ABSTRACT

An electrical sub-metering system for making available information associated with power consumption is disclosed. The system includes an electrical panel board configured to distribute power to a plurality of circuits, means for measuring voltage of each circuit, a module including means for measuring current flow, a hub in signal communication with the module and the means for measuring voltage, and a data collector in signal communication with the hub. The hub is configured to collect the information associated with power consumption from the means for measuring voltage and the module, and the data collector is configured to collect and make available to a user the information associated with power consumption for each circuit. The module is in signal communication with the hub via a single communication link, the single communication link having a plurality of communication paths.

14 Claims, 2 Drawing Sheets

FOREIGN PATENT DOCUMENTS

| | | |
|---|---|---|
| WO | 0004392 A1 | 1/2000 |
| WO | 2006078944 A2 | 7/2006 |

OTHER PUBLICATIONS

Woodward, Modbus RTU Protocol, p. 1-11.* http://www.merriam-webster.com/dictionary/of, Apr. 15, 2008, p. 1.* http://www.merriam-webster.com/dictionary/module, Apr. 15, 2008, p. 1.*

PCT International Search Report, International Application No. PCT/US2007/071630; International Filing date Jun. 20, 2007; Date of Mailing: Mar. 7, 2008.

PCT Written Opinion of the International Searching Authority; International Application No. PCT/US2007/071630; International Filing date Jun. 20, 2007; Date of Mailing: Mar. 7, 2008.

PCT International Search Report, International Application No. PCT/US2007/071632; International Filing date Jun. 20, 2007; Date of Mailing: Feb. 29, 2008.

PCT Written Opinion of the International Searching Authority; International Application No. PCT/US2007/071632; International Filing date Jun. 20, 2007; Date of Mailing: Feb. 29, 2008.

* cited by examiner

SYSTEM FOR POWER SUB-METERING

BACKGROUND OF THE INVENTION

The present disclosure relates generally to electrical power distribution, and particularly to measurement of power for at least one of a plurality of circuits. A building owner of a multi-tenant building, where deregulation has taken effect, can often purchase power from a utility provider in bulk at a wholesale rate, and re-sell it to the tenants. A sub-metering panel allows the building owner to accurately measure & bill the tenants for the power consumed by each tenant.

Sub-metering is traditionally performed by installing a current transformer (CT) on the conductor that is carrying the electrical load. There is one CT per phase of any load that is to be monitored, and each CT has two wire leads that carry the signal from the CT to the meter. These CTs are space consuming and difficult to mount. They take up wire bend space within an electrical distribution enclosure, as defined by Underwriters Laboratories (UL), and are obstructions to wires and cables in the equipment gutters and wire ways. The installation of these CTs and the extensive internal wiring is a cumbersome, time-consuming process and therefore increases the expense associated with the installation process. Another method of sub-metering is also known as modular metering. Modular metering involves installing a modular meter for each suite. This method is space consuming, as it requires a meter for each circuit to be monitored. Yet another method of sub-metering is also known as master metering. In this method of sub-metering, a building owner divides the total annual utility bill of the building by a predetermined factor, such as square footage, and number of tenants per suite, for example, and charges the suite's tenant a fraction of the total utility bill according to the predetermined factor. This method is highly inaccurate.

Accordingly, there is a need in the art for a sub-metering arrangement that overcomes these drawbacks.

BRIEF DESCRIPTION OF THE INVENTION

An embodiment of the invention includes an electrical sub-metering system for making available power consumption information. The system includes an electrical panel board configured to distribute power to a plurality of circuits, means for measuring voltage of each circuit, a module including means for measuring current flow, a hub in signal communication with the module and the means for measuring voltage, and a data collector in signal communication with the hub. The hub is configured to collect the information associated with power consumption from the means for measuring voltage and the module, and the data collector is configured to collect and make available to a user the information associated with power consumption for each circuit. The module is in signal communication with the hub via a single communication link, the single communication link having a plurality of communication paths.

Another embodiment of the invention includes an electrical sub-metering system for making available information associated with power consumption of at least one circuit of a plurality of circuits. The system includes an electrical panel board configured to distribute power to the plurality of circuits, a voltage sensor for measuring voltage of one circuit of the plurality of circuits, a current sensing module configured to measure current flow through one circuit of the plurality of circuits, a hub in signal communication with the current sensing module and the voltage sensor, and a data collector in signal communication with the hub. The current sensing module includes a micro-electromechanical system (MEMS)-based current sensor, the hub is configured to collect the information associated with power consumption calculation from the current sensing module and the voltage sensor, and the data collector is configured to collect and make available to a user the information associated with power consumption for the at least one circuit.

BRIEF DESCRIPTION OF THE DRAWINGS

Referring to the exemplary drawings wherein like elements are numbered alike in the accompanying Figures.

DETAILED DESCRIPTION OF THE INVENTION

An embodiment of the invention will provide a compact sub-metering panel that will accurately track and store the power consumption of each suite, or apartment, in a multi-tenant building. Measurements of voltage and current of each suite will be used to calculate the power consumed by the suite. In an embodiment, the compact sub-metering panel will measure the current using a MEMS-based current sensor proximate to a conductor of each sub-metered breaker, and transmit the measurement to a panel-centralized hub. In an embodiment, one of the hub, and a module including the current sensor will measure the voltage, calculate the energy and power consumed by each breaker, and output the energy and power consumption calculations to a central data collector. In an embodiment, the data collector will calculate a bill, based on the energy and power consumed by the particular suite. In an embodiment, the transmission from the hub to data collector can be one of a wired connection and a wireless connection.

Figure 1:
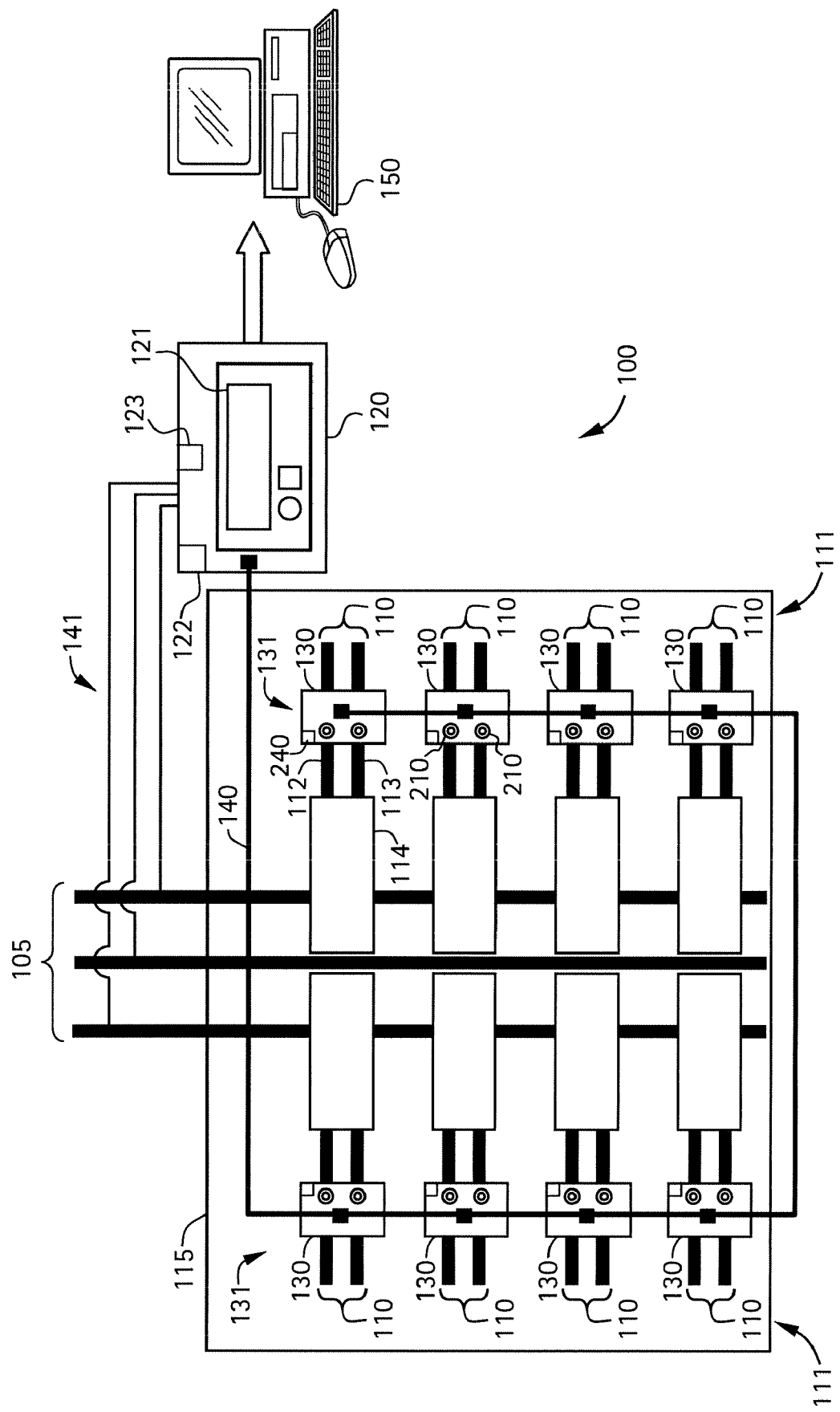
FIG. 1 depicts a schematic block diagram of an electrical sub-metering system in accordance with an embodiment of the invention.

Referring now to FIG. 1, an electrical sub-metering system 100 is depicted. In an embodiment, the sub-metering system 100 comprises an electrical panel board (also herein referred to as a panel) 115, a plurality 111 of circuits 110, a plurality 131 of current sensing modules (CSMs) (also herein referred to as modules) 130, a hub 120, and a data collector 150. In an embodiment, each CSM 130 of the plurality 131 of CSMs 130 is associated with a respective one circuit 110 of the plurality 111 of circuits.

In an embodiment, the electrical sub-metering system 100 is configured to make available to a user a power consumption calculation of at least one circuit 110 of the plurality 111 of circuits. As used herein, the term user shall refer to any person or group of persons such as a tenant, a property manager, a property management association, a utility company, and a corporate consumer of power, for example, that may be interested to be aware of the specific amount of power consumed by the specific circuit 110. In an embodiment, the amount of power consumed by the specific circuit 110, or a group of specific circuits 110, may represent the amount of power that has been consumed, such as by a specific tenant, or a specific department within a corporate setting. As used herein, the term suite shall refer to an apartment within an multi-tenant building, an office within an office building, a department within a facility, or any other sub-group of circuits that may be desired to be segregated from the entire group for the purposes of measurement and tracking of power consumption.

In an embodiment, the electrical panel board 115 is configured to distribute power from a common source, or feed 105 to the plurality 111 of circuits 110, each circuit 110 capable of identification as representing a unique point of power consumption, as described above. In an embodiment, the CSM 130 is configured to measure, or monitor, the current flow through each circuit 110 of the plurality 111 of circuits. It will be appreciated that while an embodiment of the invention has been depicted having the CSM 130 in connection with all circuits 110 of the plurality 111 of circuits 110, that the scope of the invention will not be so limited, and that the invention will also apply to sub-metering systems 100 that may have the CSM 130 in connection with any portion of the plurality 111 of circuits 110.

In an embodiment, the hub 120 is in signal communication with the plurality 131 of CSMs 130 via a single communication link 140, and the electrical panel board 115 via feed 105 connections 141. In an embodiment, the hub 120 is configured to collect information associated with power consumption from the CSM 130 and the panel 115. In an embodiment, the data collector 150 is in signal communication with the hub 120, which is configured to collect and to make available to the user the power consumption calculation derived from the information associated with power consumption for each circuit 110 that is in connection with the CSM 130. In an embodiment, the hub 120 includes a voltage sensor (alternatively referred to as a means for measuring voltage) 123 configured to measure the voltage of each circuit 110. It will be appreciated that the voltage sensor 123 may be one of many types known in the art, such as a resistive bridge network configured to measure voltage, for example.

While an embodiment of the invention has been described and depicted with one hub 120 in signal communication with the data collector 150, it will be appreciated that the scope of the invention is not so limited, and that the invention will also apply to electrical sub-metering systems 100 that may include alternate arrangements of the hub and the data collector, such as having more than one hub in signal communication with a single data collector, one hub in signal communication with more than one data collector, and more than one hub in signal communication with more than one data collector, for example. Further, while an embodiment has been depicted with one CSM in signal communication with the hub, it will be appreciated that the scope of the invention is not so limited, and that the invention will also apply to electrical sub-metering systems 100 that may have alternate arrangements of the CSM and the hub, such as more than one CSM in signal communication with one hub, for example.

In an embodiment, the CSM 130 includes a micro-electromechanical system (MEMS)-based current sensor, as described in commonly assigned U.S. Patent Application Publication No. 2005/0270014 entitled "Micro-Electromechanical System (MEMS) Based Current & Magnetic Field Sensor Having Capacitive Sense Components", and U.S. Patent Application Publication No. 2005/0248340 entitled "Microelectromechanical System Sensor and Method for Using", the contents of which are herein incorporated by reference in their entirety.

While an embodiment of the invention has been described having a current sensing module including a MEMS-based current sensor, it will be appreciated that the scope of the invention is not so limited, and that the invention will also apply to electrical sub-metering systems 100 using CSMs having alternate current sensors, such as hall-effect current sensors, for example.

Figure 2:
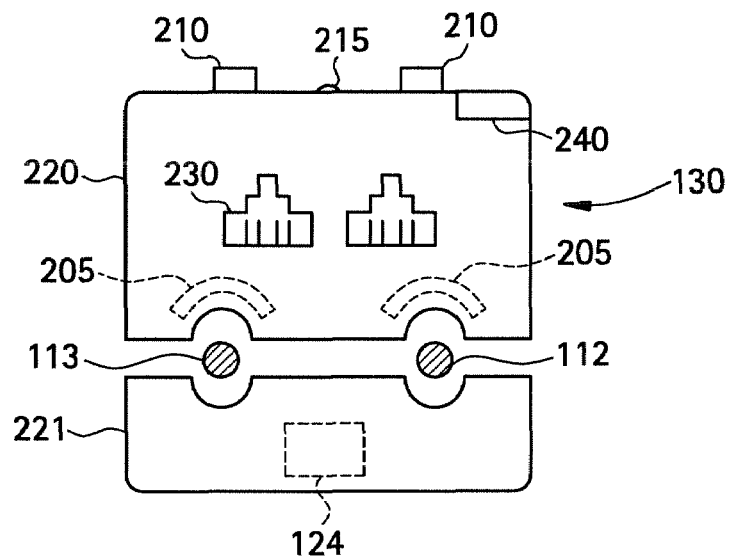
FIG. 2 depicts a schematic representation of an exemplary current sensing module in accordance with an embodiment of the invention.

With reference now to FIGS. 1 and 2, an exemplary embodiment of the CSM 130 is depicted. In an embodiment, a circuit breaker 114 is in power connection with a conducting cable (also herein referred to as a conductor) 112, 113 of the circuit 110, and disposed within the panel 115. In the embodiment depicted in FIG. 2, current sensors (alternatively referred to as means for measuring current flow) 205 are depicted disposed within the CSM 130. In an embodiment, the CSM 130 includes the current sensors 205 and their appropriate interface electronics. In an embodiment, the interface electronics of the CSM 130 are configured to amplify, sample, and process a sensed, or measured, current flow, and to make available to the hub 120 a signal representative of the sensed current flow. In another embodiment, the interface electronics are configured to be receptive of a signal representative of the circuit 110 voltage, to calculate the power consumed, and to make available to the hub 120 the power consumption calculation. In an embodiment, the CSM 130 is a modular design having a two-piece housing 220, 221 to allow the current sensors 205 of the CSM 130 to be installed without the need to remove the conductor 112, 113 from the breaker 114, or any other connection made with the conductor 112, 113. In another embodiment, the MEMS-based current sensor 205 is disposed proximate the conductor 112, 113 of one of the plurality 111 of circuits 110, and the MEMS-based current sensor 205 is configured to be absent complete enclosure of the conductor 112, 113. In another embodiment, the MEMS-based current sensor 205 is disposed proximate the circuit breaker 114. In an embodiment, the CSM 130 additionally includes a voltage sensor 124, such as a resistive bridge network configured to measure voltage, for example.

In an embodiment, the MEMS-based current sensor 205 is clipped onto the conductor 112, 113, allowing an installer a simple means to retrofit panels 115 that were not originally configured to provide sub-metering functionality. While the clip of the current sensor 205 may completely encircle or enclose the conductor 112, 113, as previously discussed, the actual MEMS-based current sensor 205 is configured to be absent complete enclosure of the conductor 112, 113. In an embodiment, the current sensor 205 is attached, or clipped, onto the conductor 112, 113 absent a split-core transformer, as may be used in other sub-metering applications. In an embodiment, the MEMS-based current sensor 205 provides current measurements having enhanced accuracy over split-core current transformers.

In an embodiment, the information associated with power consumption, including signals representative of the measured current flows, are to be transmitted via wired communications from the CSM 130 to the hub 120. In an embodiment, multiple CSMs 130 are linked together, in series, to the hub 120 by a connection arrangement referred to as a daisy-chain connection. In an embodiment, each of the plurality 131 of CSMs 130 further comprises an address switch 210 for identifying the CSM 130 associated with the information associated with power consumption of the respective circuit 110 through which the measured current flows. In an embodiment, the CSM 130 shall have a LED 215, to indicate operation status of the CSM 130, and a cable port 230 for interconnection with other CSMs 130 and the hub 120. In an embodiment, the CSM 130 includes more than one cable port 230. In an embodiment, the address switch 210 allows an installer of the CSM 130 to set, or define, the address of each CSM 130 to identify the current measurements that relate to each circuit, and ultimately, each sub-metered suite. In an embodiment, the address of the CSM 130, which correlates the sub-metered circuit 110 to the sub-metered suite, is set by the installer and transmitted with the signals representative of the measured current flow.

While an embodiment of the invention has been described and depicted having an address switch, it will be appreciated that the scope of the invention is not so limited, and that the invention will also apply to other means to identify the circuit through which the measured current flows, such as a dial, a pre-assigned serial number associated with the CSM, and a software-assigned identifier, such as an IP address that may be provided by one of the hub and the data collector, for example.

Figure 3:
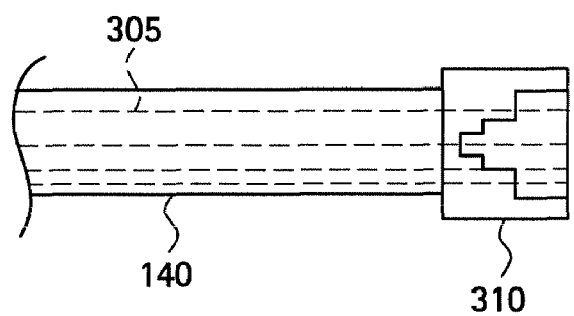
FIG. 3 depicts a schematic representation of an exemplary communication link in accordance with an embodiment of the invention.

In an embodiment, the plurality 131 of the CSMs 130 is in signal communication with the hub 120 via the single communication link 140. Referring now to FIG. 3, an exemplary embodiment of the single communication link 140 is depicted. In an embodiment, the single communication link 140 has a plurality of communication paths 305, or conductors. In an embodiment, the single communication link 140 comprises a single connector 310 at each end thereof configured to connect the plurality of communication paths 305 to the hub 120 at one end of the link 140 and the CSM 130 at the other end of the link 140. In an embodiment, the single connector 310 is an RJ45 type of connector that is often used to provide computer-networking connections. Use of the single connector 310 allows for simple and time efficient connections between the plurality 131 of CSMs 130 and the hub 120.

While an embodiment of the invention has been described having an RJ45 connector, it will be appreciated that the scope of the invention is not so limited, and that the invention will also apply to electrical sub-metering systems having any other variety of multi-conductor connectors, such as RJ25 connectors, DE9 connectors, and Universal Serial Bus (USB) connectors, for example, to allow simple and time efficient connection between the CSMs and the hub.

In an embodiment, each CSM 130 of the plurality 131 of CSMs 130 are associated with a respective one circuit 110 of the plurality 111 of circuits. In an embodiment, the single communication link 140 is configured to provide to the hub 120 the information associated with the power consumption calculation for the plurality 131 of the CSMs 130. In an embodiment, the information associated with the power consumption calculation is identified by circuit 110 via the address switch 210. In an embodiment, each CSM 130 of the plurality 131 is in signal communication with at least one other CSM 130 of the plurality 131 of CSMs 130.

While an embodiment of the invention has been depicted with the plurality of CSMs in signal communication with the hub via a single communication link, it will be appreciated that the scope of the invention is not so limited, and that the invention will also apply to electrical sub-metering systems having other communication link arrangements, such as two, three, four, or more, sets of CSMs, with each set in signal communication with the hub via the single communication link, and each CSM of each set in signal communication with at least one other CSM, for example.

In another embodiment, the CSM 130 includes a wireless communication device 240, and the hub 120 includes a wireless communication device 122. In an embodiment, the hub 120 is in signal communication with the CSM 130 via a wireless connection provided by the wireless communication devices 240, 122.

In an embodiment, the voltage is measured across a set of bus bars of the power feed 105 in the panel 115, and referenced to neutral via the voltage sensor 123. In an embodiment, the current and voltage measurements are synchronized via a communication protocol or synchronization pulse. The measured current and voltage of the circuit 110 is used to perform the energy and power consumption calculations corresponding to the circuit 110. In an embodiment, the hub 120 may also include a display screen 121, to allow the user to view one of stored and real-time data, per suite. In another embodiment, the display screen 121 of the hub 120 may be used to display and define the addresses of the CSMs 130. In an embodiment, the hub 120 is disposed within the panel 115. In another embodiment, the hub 120 is attached to the panel 115.

In an embodiment, one of the energy consumption calculation and the power consumption calculation is transmitted from the hub 120 to the data collector 150. In an embodiment, the data collector is configured to utilize the transmitted consumption calculations to determine the energy bill per suite. In an embodiment, billing-tracking software correlates each power consumption value with the particular suite, at particular rates, which may be set by the utility, building owner, or billing company. In an embodiment, this billing information can be transmitted via one of wired and wireless communication to the building owner, or billing company. In an embodiment, the data collector can also operate as a part of a Supervisory Control And Data Acquisition (SCADA) system, configured to monitor and control a variety of functions of a manufacturing site, for example.

Figure 4:
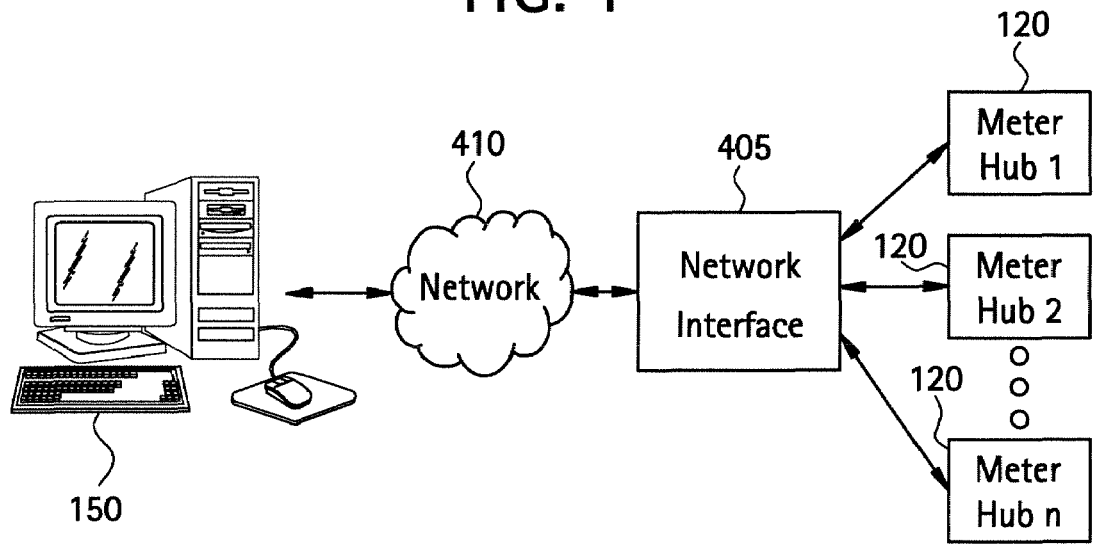
FIG. 4 depicts a pictorial schematic representation of a connection between a plurality of hubs and a data collector in accordance with an embodiment of the invention.

Referring now to FIG. 4, an exemplary embodiment of the connection between a plurality of hubs 120 and the data collector 150 is depicted. The connection between the hubs 120 and the data collector 150 is provided by a network connection 410 via a network interface 405, as depicted. In an embodiment, the data collector 150 is in signal communication with the hub 120 via the following types of network connection 410: an Ethernet connection; a direct serial connection; a dial-up connection; and, a power line connection. In an embodiment, the Ethernet connection 410 includes one of an Internet connection, an Intranet connection, an Extranet connection, and a dial-up connection. In an embodiment, the Ethernet connection includes one of a wired Ethernet connection and a wireless Ethernet connection. In an embodiment that provides a wireless Ethernet connection 410, the network interface 405 includes an Ethernet wireless router. In an embodiment that provides a wired Ethernet connection 410, the network interface 405 comprises one of an Ethernet Hub, an Ethernet Switch, and an Ethernet Router. In an embodiment that provides a direct serial connection 410, the network interface 405 comprises a RS485/RS232 Converter. In an embodiment that provides a power line connection 410, network interface 405 includes at least one Ethernet to power line carrier bridge. In an embodiment that provides a dial-up connection 405, the network interface 405 includes a dial up to Ethernet gateway modem.

In view of the foregoing, embodiments of the sub-metering system 100 are configured as follows.

In an embodiment, the hub 120 is configured to provide to the CSM 130 the information associated with power consumption, including a signal representative of voltage of the circuit 110 corresponding with the measured current flow. The CSM 130 further includes means, such as a processing circuit, for example, for performing the power consumption calculation using the information associated with power consumption provided by the hub 120, and is configured to provide to the hub 120 the power consumption calculation. In an embodiment, the hub 120 is configured to provide to the CSM 130 a scaled plurality of phases voltage signal, such as a scaled three-phase voltage, for example, and the CSM 130 is configured to capture the scaled plurality of phases voltage signal. In another embodiment, the hub 120 is configured to synchronize sampling of current and voltage of each of the plurality 111 of circuits 110, and to capture and provide to the CSM 130, samples of the voltage of the circuit 110 corresponding with the measured current. In another embodiment, the hub 120 is configured to synchronize sampling of current and voltage of each of the plurality 111 of circuits 110. The hub 120 is also configured to capture and transform samples of the voltage of the circuit 110 corresponding with the current measurement into a signal comprising voltage magnitude and phase, and to provide to the CSM 130 the signal comprising voltage magnitude and phase.

While an embodiment of the invention has been described having a voltage signal including a plurality of phases, such as three phases, it will be appreciated that the scope of the invention is not so limited, and that the invention will also apply to other sub-metering systems that may have other numbers of phases in a polyphase system, such as two, four, five, six, or more phases, as well as single phase systems, for example.

In another embodiment, the hub 120 is configured to capture samples of voltage of the circuit 110 corresponding with the measured current. The hub 120 is also configured to synchronize sampling of current and voltage of each of the plurality 111 of circuits 110, and to request from the CSM 130 samples of the measured current corresponding with the captured samples of voltage. The CSM 130 is configured to be responsive to the request from the hub 120, and to make available to the hub 120 the samples of the measured current corresponding with the captured samples of voltage, and the hub 120 is configured to perform the power consumption calculation of the circuit 110. In an embodiment, the hub 120 is configured to transform the captured samples of voltage of the circuit 110 into a signal comprising voltage magnitude and phase. The CSM 130 is configured to be responsive to the request from the hub 120, and to make available to the hub 120 a signal representative of current magnitude and phase corresponding with the transformed samples of voltage.

As disclosed, some embodiments of the invention may include some of the following advantages: the ability to reduce overall sub-metering panel dimensions as a result of the use of MEMS-based current sensors; the ability to increase sub-metering power calculation accuracy; the ability to increase installation ease of sub-metering functionality in existing systems lacking such functionality; and the ability to reduce electrical panel ventilation requirements as a result of reduced heat generation by MEMS-based current sensors.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An electrical sub-metering system for making available information associated with power consumption of at least one circuit of a plurality of circuits, the system comprising:
    an electrical panel board configured to distribute power to the plurality of circuits;
    means for measuring voltage of each circuit of the plurality of circuits;
    a plurality of modules, each module of the plurality of modules comprising means for measuring current flow through at least one circuit of the plurality of circuits;
    a hub in signal communication with the means for measuring voltage and the plurality of modules, the hub configured to collect the information associated with power consumption from the means for measuring voltage and the plurality of modules; and
    a data collector in signal communication with the hub, the data collector configured to collect and make available to a user the information associated with power consumption for each circuit;
    wherein,
    a first module of the plurality of modules is in signal communication with the hub via a first single communication link,
    each additional module of the plurality of modules is operatively connected to a neighboring module of the plurality of modules with a single communication link, and
    the first single communication link and the single communication links between each module of the plurality of modules are configured to provide communication between the plurality of modules and the hub.

2. The system of claim 1, wherein:
    each of the plurality of circuits has associated therewith one of the plurality of the modules; and
    each module of the plurality of modules being in signal communication with at least one other of the plurality of modules.

3. The system of claim 1, wherein:
    the means for measuring current flow is disposed proximate a conductor of one circuit of the plurality of circuits, the means for measuring current flow configured to be absent complete enclosure of the conductor.

4. The system of claim 1, wherein:
    the single communication links comprise a single connector at each end thereof configured to connect a plurality of communication paths to the hub and to a module at one end of the link.

5. The system of claim 1, wherein:
    the hub is configured to provide to each module of the plurality of modules a signal representative of voltage of the circuit corresponding with the measured current flow;
    each module of the plurality of modules further comprises means for performing a power consumption calculation using the information associated with power consumption; and
    each module of the plurality of modules further comprises means for communicating to the hub the power consumption calculation.

6. The system of claim 1, wherein:

the hub is configured to capture samples of a voltage of the circuit corresponding with the measured current flow;

the hub is configured to synchronize sampling of current and voltage of each of the plurality of circuits, and to request from each module of the plurality of modules samples of the measured current flow corresponding with the captured samples of voltage;

each module of the plurality of modules comprises means for responding to the request from the hub, and means for making available to the hub the samples of the measured current flow corresponding with the captured samples of voltage; and the hub is configured to perform a power consumption calculation using the information associated with power consumption of the circuit.

7. The system of claim 1, wherein:

the data collector is in signal communication with the hub via one of an Ethernet connection, a direct serial connection, a dial-up connection, and a power line connection.

8. The system of claim 3, further comprising:

a circuit breaker disposed within the electrical panel board, the circuit breaker in power connection with the conductor of the one circuit;

wherein the means for measuring current flow is disposed proximate the circuit breaker.

9. The system of claim 4, wherein:

the single connector is an RJ45 connector.

10. The system of claim 5, wherein:

the hub is configured to provide to each module of the plurality of modules a scaled plurality of phases voltage signal; and each module of the plurality of modules further comprises means for capturing the scaled plurality of phases voltage signal.

11. The system of claim 5, wherein:

the hub is configured to synchronize sampling of current and voltage of each of the plurality of circuits; and the hub is configured to capture, and provide to each module of the plurality of modules, a sample of voltage of a circuit corresponding with the measured current flow.

12. The system of claim 5, wherein:

the hub is configured to synchronize sampling of current and voltage of each of the plurality of circuits;

the hub is configured to capture and transform samples of the voltage of a circuit corresponding with the measured current flow into a signal comprising voltage magnitude and phase; and the hub is configured to provide to each module of the plurality of modules the signal comprising voltage magnitude and phase.

13. The system of claim 6, wherein:

the hub is configured to transform the captured samples of voltage of the circuit into a signal comprising voltage magnitude and phase; and each module of the plurality of modules comprises means for responding to the request from the hub, and means for making available to the hub a signal representative of current magnitude and phase corresponding with the transformed samples of voltage.

14. The system of claim 7, wherein:

the Ethernet connection comprises one of an Internet connection, an Intranet connection, an Extranet connection, and a dial-up connection; and the Ethernet connection comprises one of a wired Ethernet connection and a wireless Ethernet connection.

* * * * *